United States Patent [19]

Kondo et al.

[11] Patent Number: 5,303,671
[45] Date of Patent: Apr. 19, 1994

[54] SYSTEM FOR CONTINUOUSLY WASHING AND FILM-FORMING A SEMICONDUCTOR WAFER

[75] Inventors: Hiroshi Kondo, Tokyo; Mitsuhiro Tachibana, Yamanashi, both of Japan

[73] Assignee: Tokyo Electron Limited, Tokyo, Japan

[21] Appl. No.: 14,150

[22] Filed: Feb. 5, 1993

[30] Foreign Application Priority Data

Feb. 7, 1992 [JP] Japan ............................. 4-057003
Feb. 7, 1992 [JP] Japan ............................. 4-057004

[51] Int. Cl.$^5$ ............................................. C23C 16/00
[52] U.S. Cl. ............................. 118/719; 156/345; 118/725
[58] Field of Search ............... 118/719, 725; 156/345

[56] References Cited

U.S. PATENT DOCUMENTS 4,592,306 6/1986 Gallego ........................ 118/719

FOREIGN PATENT DOCUMENTS 61-101032  5/1986  Japan .
61-276225 12/1986  Japan .

*Primary Examiner*—Richard Bueker
*Attorney, Agent, or Firm*—Oblon, Spivak, McClelland, Maier & Neustadt

[57] ABSTRACT

A system for cleaning and film-forming a semiconductor wafer continuously comprises a washing section for removing native oxide from the surface of the wafer while applying hydrofluoric acid to the silicon wafer, a load lock chamber located adjacent to the washing section and filled with the atmosphere of non-oxidizing gas, a film-forming section communicated with and shielded from the load lock chamber by a gate valve to form film on that face of the wafer which is to be processed, a first transfer robot for transferring the wafer between the washing section and the load lock chamber, and a second transfer robot for transferring the wafer between the load lock chamber and the film-forming section. Film is formed on the wafer in the film-forming section after the native oxide is removed from the wafer.

12 Claims, 6 Drawing Sheets

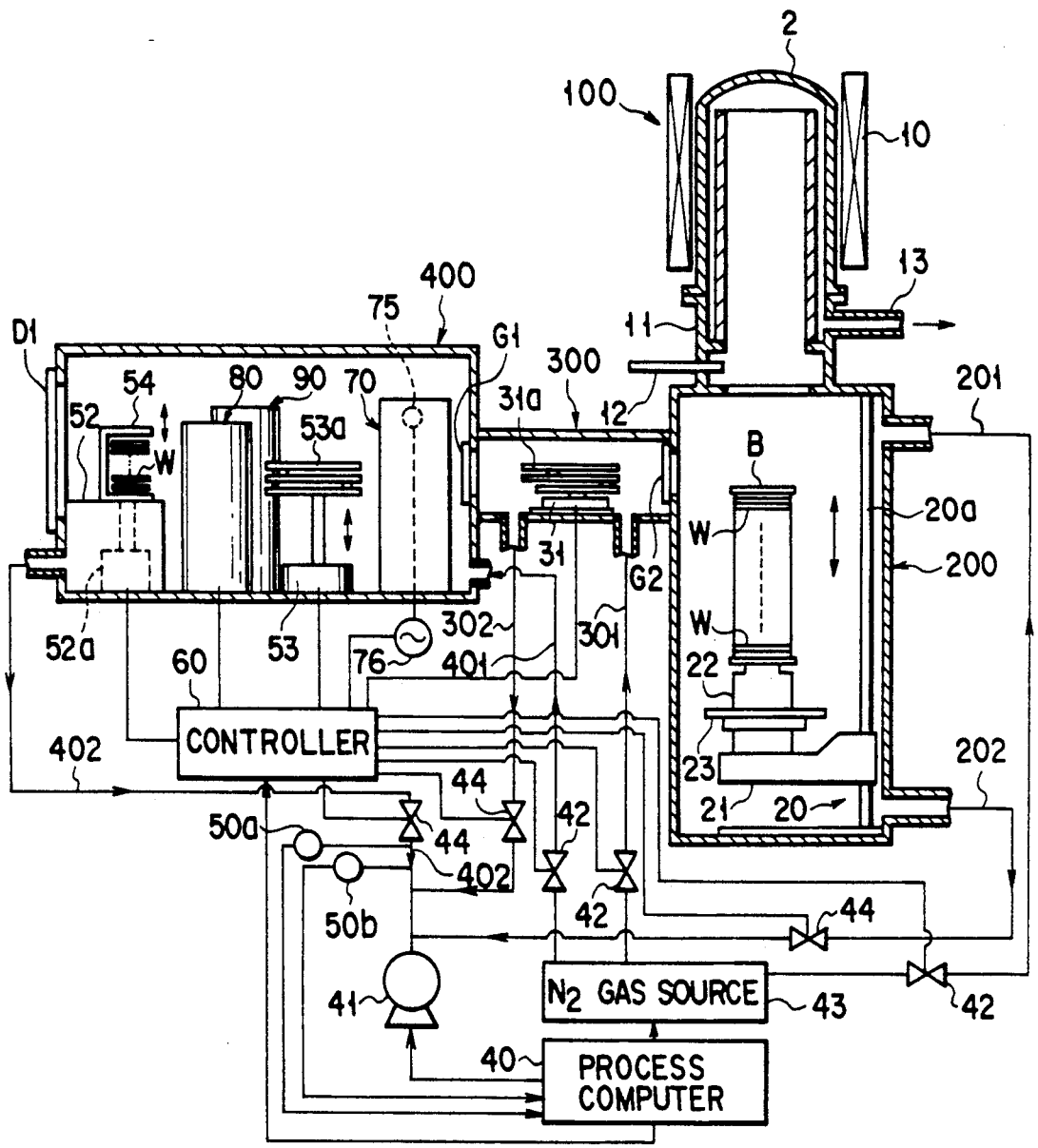
F I G. 1

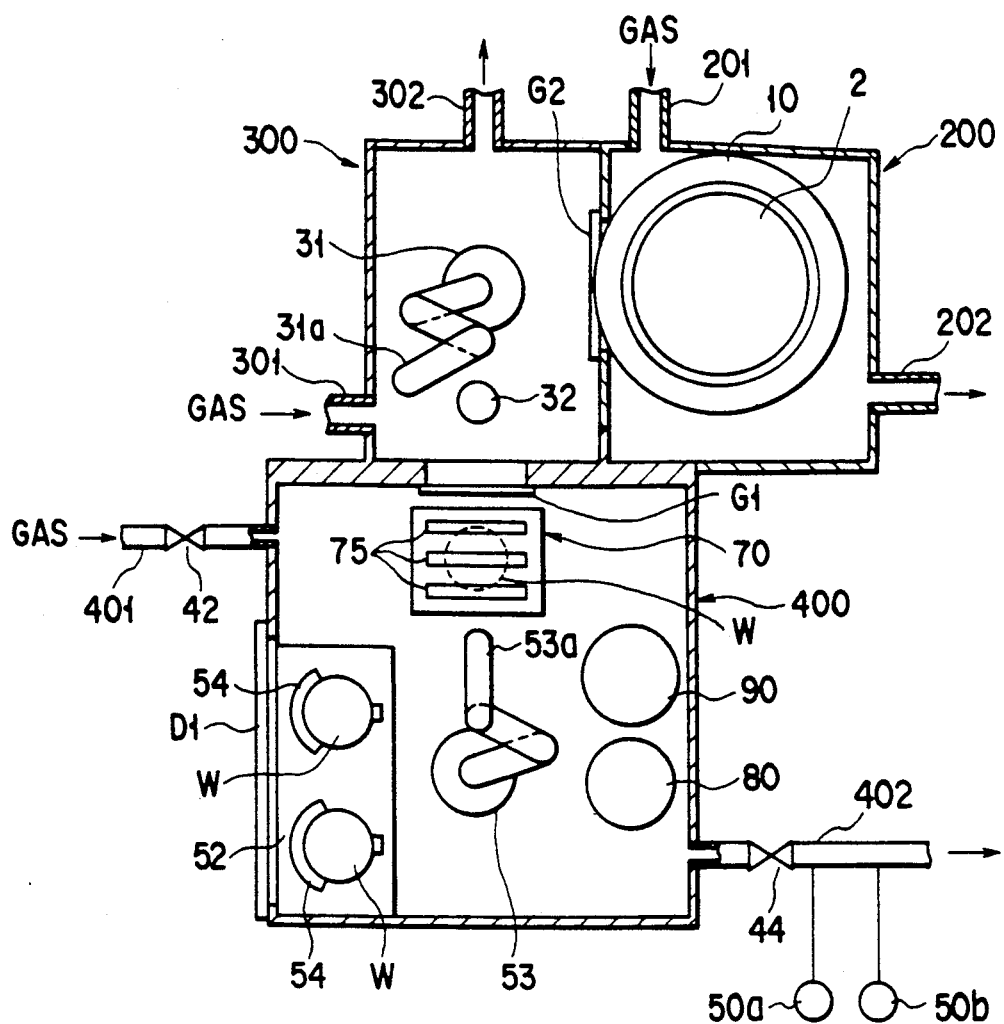
F I G. 2
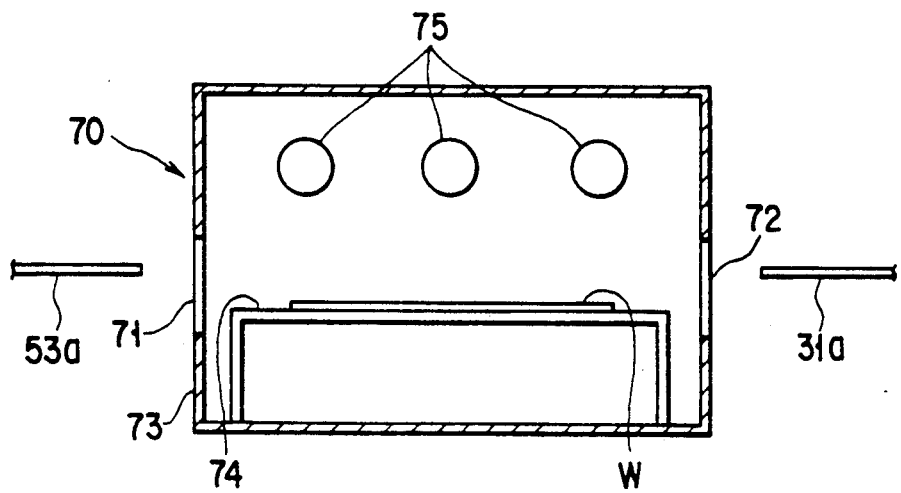
F I G. 3

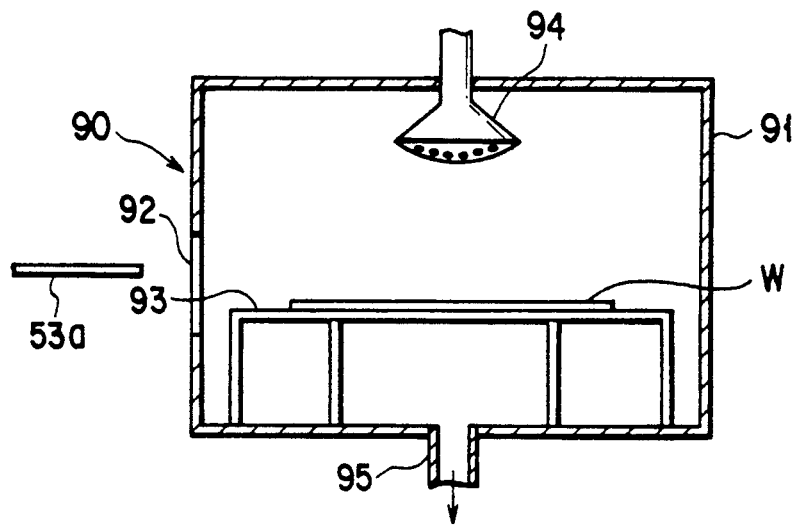
F I G. 6
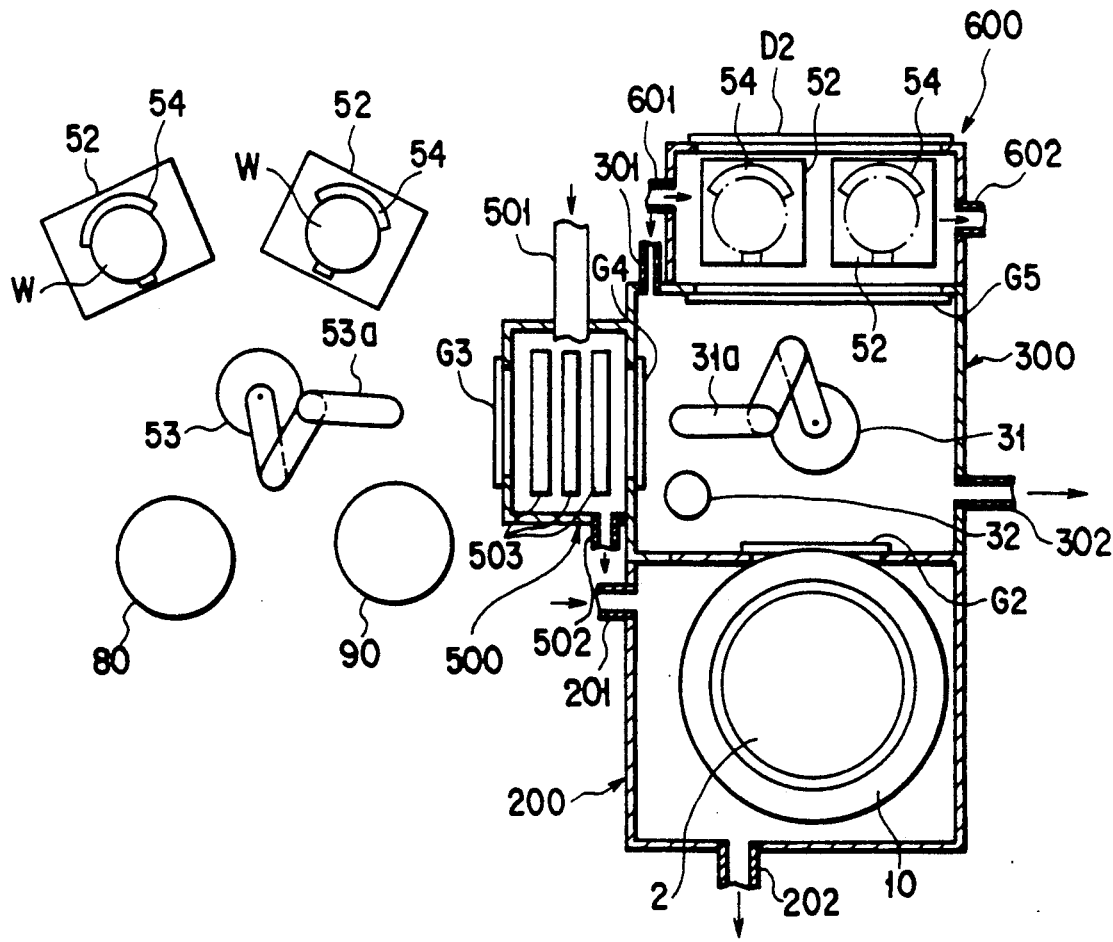
F I G. 8

SYSTEM FOR CONTINUOUSLY WASHING AND FILM-FORMING A SEMICONDUCTOR WAFER

BACKGROUND OF THE INVENTION

1. Field of the Invention

The present invention relates to a system for washing and film-forming a semiconductor wafer continuously.

2. Description of the Related Art

When the semiconductor wafer reacts with oxygen in the air in the semiconductor devices producing process, native oxide is created on the surface of the wafer. This native oxide increases the thickness of gate oxide film and the contact resistance. It is therefore needed that the native oxide is removed from the wafer to stop its growth before the following film-forming process is applied to the wafer.

When the wafer is loaded into the process tube in a case where the film-forming process is applied to it under high temperature, air is swallowed up into the process tube by convection. As the result, the wafer reacts with oxygen to develop the growth of the native oxide. It has been therefore discussed these days that the wafers are loaded into and unloaded from the wafer boat while filling the lower area of the vertical process tube with the atmosphere of inactive gas.

On the other hand, semiconductor devices are more and more highly intergated and the capacity of a DRAM is about to increase from 4M to 16M, 32M and more. In order to meet this state, the thickness of oxide film must be controlled with higher accuracy and excessive native oxide must be removed when capacitor film is to be formed.

Accordingly it is not sufficient that the growth of the native oxide is stopped as seen in conventional cases only when the wafer is loaded into the process tube. But it is needed to remove the native oxide of about 10 Å which is caused when silicon reacts with oxygen and water in the air while the wafer is being carried from the washing section to the film-forming station.

Even when the native oxide is once removed from the wafer, it grows again while the wafer is on its way to the following station because the film-forming station is located remote from the washing station in the conventional system. Further, the wafer which has been washed are often kept waiting because the timing at which the wafer is processed in the washing station is quite different from those timings at which it is processed in the other stations.

The native oxide which had re grown in this manner was conventionally negligible because it was quite thinner than such native oxide that was caused when the wafer was loaded into the process tube. When a DRAM comes how to have a capacity larger then 32M, however, the thickness of oxide film must be controlled with a higher accuracy and excessive native oxide must be removed from the wafer even when capacitor film is to be formed. Even the growth of quite thin native oxide must be stopped under these circumstances.

SUMMARY OF THE INVENTION

The object of the present invention is therefore to provide a system for continuously washing and film-forming a semiconductor wafer, said system being capable of forming film on the wafer in the film-forming station while keeping the re-growth of native oxide on the wafer as small as possible after the native oxide which has grown till then is removed in the washing station.

According to an aspect of the present invention, a system for continuously cleaning and film-forming a semiconductor wafer can be provided comprising a washing section for removing native oxide from the surface of the semiconductor wafer, which is to be film-formed, while applying an intended solution to the wafer; a load lock chamber located adjacent to the washing section and filled with the atmosphere of non-oxidizing gas; a film-forming section provided with gate means and communicated with and shielded from the load lock chamber by the gate means to apply the film-forming process to that face of the wafer which is to be processed; first transfer means for transferring the wafer between the washing section and the load lock chamber; and second transfer means for transferring the wafer between the load lock chamber and the film-forming section; wherein the wafer is film-formed in the film-forming section after the native oxide is removed from the wafer in the washing section.

The native oxide is removed from the wafer in the washing section before the film-forming process. Immediately after this, the wafer is introduced into the load lock chamber filled with the atmosphere of inactive gas. in other words, the wafer is put in the atmosphere of inactive ga immediately after the native oxide is removed from the wafer, and it is loaded into the film-forming section while being kept in this atmosphere. This enables the film-forming process to be applied to that clean surface of the wafer on which the growth of the native oxide is stopped.

When the wafer which has been washed clean is heated, the by-product which has grown on the surface of the wafer can be decomposed to thereby made the surface of the wafer more clean. Heating means may be arranged in the additional chamber, in the load lock chamber or in a chamber arranged independent of the others.

Nitrogen gas, argon gas, helium gas or mixed gas of nitrogen gas with one of them may be used as the non-oxidizing gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a vertically-sectioned view schematically showing the system for processing semiconductor wafers continuously from washing section to film-forming section according to a first embodiment of the present invention;

FIG. 2 is a plan showing the system;

FIG. 3 is a vertically-sectioned view schematically showing a heating unit employed by the system;

FIG. 6 is a vertically-sectioned view showing a rising unit (or water-washing chamber) employed by the system;

FIG. 8 is a plan showing the system according to a second embodiment of the present invention.

DETAILED DESCRIPTION OF THE PREFERRED EMBODIMENTS

Figure 4:
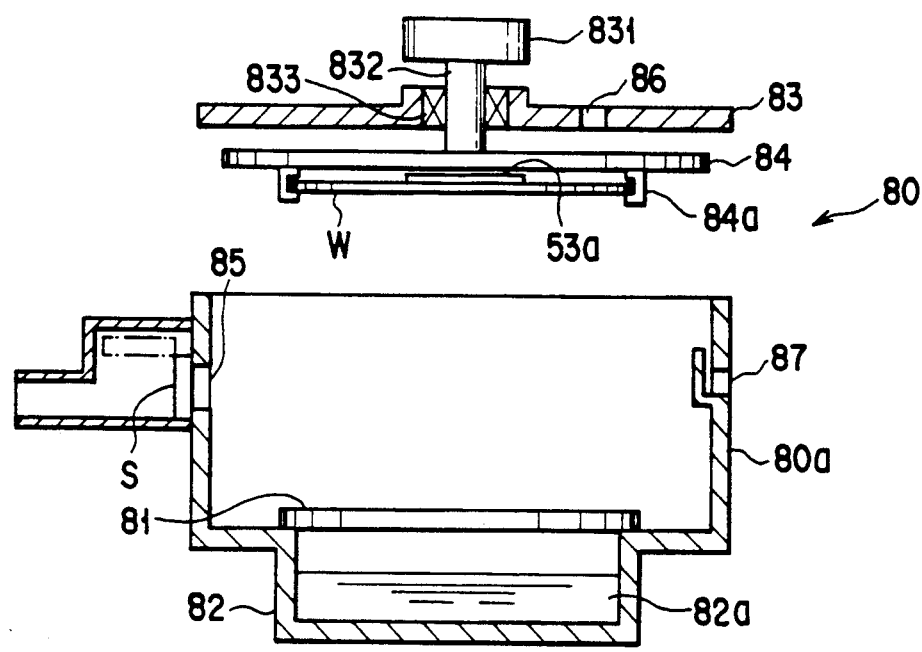
FIG. 4 is a vertically-sectioned view schematically showing a washing unit employed by the system, the washing unit keeping its top lid opened.

Some cases where some systems of the present invention are applied to the CVD apparatus of the vertical type will be described with reference to the accompanying drawings.

As shown in FIG. 1, a boat loading/unloading chamber (or lower chamber) 100 is arranged right under a heat process section 100 of the CVD apparatus of the vertical type. A load lock chamber 300 is arranged adjacent to the lower chamber 200. Further, an additional chamber 400 is arranged adjacent to the load lock chamber 300. A system for processing semiconductor wafers continuously from washing to film-forming section comprises these chambers 200, 300 and 400 and housed air-tight in a clean room.

The chambers 200, 300 and 400 are arranged relative to the others as shown in FIG. 2. A partition wall between the chambers 300 and 400 has an opening and a gate G1 is arranged to close the opening of the partition wall. Another partition wall between the chambers 200 and 300 also has an opening and another gate G2 is arranged to close the opening of this another partition wall. Another side wall of the additional chamber 400 also has an opening and a door D1 is arranged to close the opening of this side wall. When the door D1 is opened, the additional chamber 400 is communicated with atmosphere in the clean room. A wafer cassette 54 on a boat (now shown) is carried into the additional chamber 400 through that opening of the chamber 400 which is closed by the door D1.

Opening and closing of the gates G1, G2 and the door D1 are controlled by a controller 60 which is backed up by a computer system 40. The gate G1 is located in the center of the partition wall between the chambers 300 and 400. The gate G2 is located at the upper portion of the partition wall between the chambers 200 and 300.

As shown in FIG. 1, gas supply and discharge passages are communicated with each of the chambers 200, 300 and 400 and atmospheres in these chambers are controlled independently of the others. More specifically, gas supply and discharge passages or pipes 201 and 202 are communicated with the chamber 200, gas supply and discharge pipes 301 and 302 with the chamber 300 and gas supply and discharge pipes 401 and 402 with the chamber 400. The gas supply pipes 201, 301 and 401 are communicated with a gas supply source 43 through their flow rate adjuster valves 42. Nitrogen gas is supplied from the gas supply source 43 to the chambers 200, 300 and 400 in this case, but argon gas, helium gas or mixed gas of one of these with nitrogen may be supplied to the chambers 200, 300 and 400.

The gas discharge pipes 202, 302 and 402 are communicated with the intake side of a vaccum pump 41 through their switch valves 44. $O_2$ sensor 50a and humidity sensor 50b are provided to the gas discharge pipe 402 of the additional chamber 400. The $O_2$ sensor 50a is intended to detect oxygen gas in the gas discharged from the additional chamber 400 and the humidity sensor 50b to detect humidity in the discharged gas. Both of them are connected to the input side of the process computer 40.

A process tube 2 made of quartz is arranged in the heat process section 100. A heater 10 encloses the process tube 2. A manifold 11 is connected to the bottom of the process tube 2 and process gas is supplied into the process tube 2 through a gas supply pipe 12 of the manifold 11. Waste gas in the process tube 2 is discharged outside through a discharge pipe 13 of the manifold 11.

A boat loading/unloading mechanism 20 is arranged in the lower chamber 200. A boat B is mounted on an elevator 21 of this mechanism 20. 99 sheets of silicon wafers W can be mounted, maximum, on the boat B. A heat insulating sleeve 22 and a flange 23 are interposed between the elevator 21 and the wafer boat B. A ball screw 20a is screwed into the nut portion of the elevator 21. A drive motor (not shown) for the mechanism 20 is controlled by the controller 60.

A wafer transfer or carriage mechanism 31 is housed in the load lock chamber 300. The wafer transfer mechanism 31 includes a multi-joint arm 31a movable up and down, rotatable and expansible. The multi-joint arm 31a moved along axes X, Y and Z and rotated in a direction $\theta$ is controlled by the controller 60. A pre alignment mechanism 32 is arranged between the gate G1 and the wafer transfer mechanism 31 to pre-align the orientation fat of each of the semiconductor wafers W in a desired direction.

The additional chamber 400 will be described n detail referring to FIGS. 1 through 6.

The additional chamber 400 houses therein a wafer transfer mechanism 53, a cassette stage 52, heating, washing and rising units 70, 80 and 90. The wafer transfer mechanism 53 is located substantially in the center of the additional camber 400 and the cassette stage 52, the heating, washing and rising units 70, 80 and 90 are arranged around the wafer transfer mechanism 53. The wafer transfer mechanism 53 is substantially same as the one 31 in the chamber 300, but the former has longer stroke movable in the direction Z than the latter has. Each of the wafer transfer mechanisms 31 and 53 has a vaccum suction holder to attract and hold the wafer W on each of arms 31a and 53a.

The cassette stage 52 is located adjacent to the door D1. Plural wafer cassettes 54 are mounted on the cassette stage 52. The wafer cassettes 54 can be moved up and down by elevator mechanism 52a, which are controlled by the controller 60.

The heating unit 70 is arranged between the wafer transfer mechanism 53 and the gate G1. As shown in FIG. 3, three infrared ray lamps 75 are arranged in the upper portion of the heating unit 70 to heat the wafers W on a stage 74. A power source 76 of these lamps 75 is controlled by the controller 60. When the wafers W are washed by the washing unit 80 which will be described later, by product comprising mainly water is caused on the surface of each of the wafers by hydrofluoric acid. The infrared ray lamps 75 are intended to heat and decompose this by-product.

The heating unit 70 has two openings 71 and 72 in its side walls 73. The arm 53a of the wafer transfer mechanism 53 is inserted into the unit 70 through the opening 71 and the arm 31a of the wafer transfer mechanism 31 into the unit 70 through the other opening 72. It is preferable that the stage 74 is so latticed as to easily removed liquid adhered from the wafers W.

The washing unit 80 will be described referring to FIGS. 4 and 5.

The washing unit 80 comprises a process vessel 80a and a top lid 83 which can be detached from each other. More specifically, the top lid 83 is supported by an elevator (not shown) to move up and down. A recess 82 extends downward from the bottom of the process vessel 80a, and hydrofluoric acid solution 82a having a density of 1-5% is stayed in the recess 82. A switch valve 81 is located to cover the recess 82 and it is supported, movable up and down, by an elevator (not shown).

Figure 5:
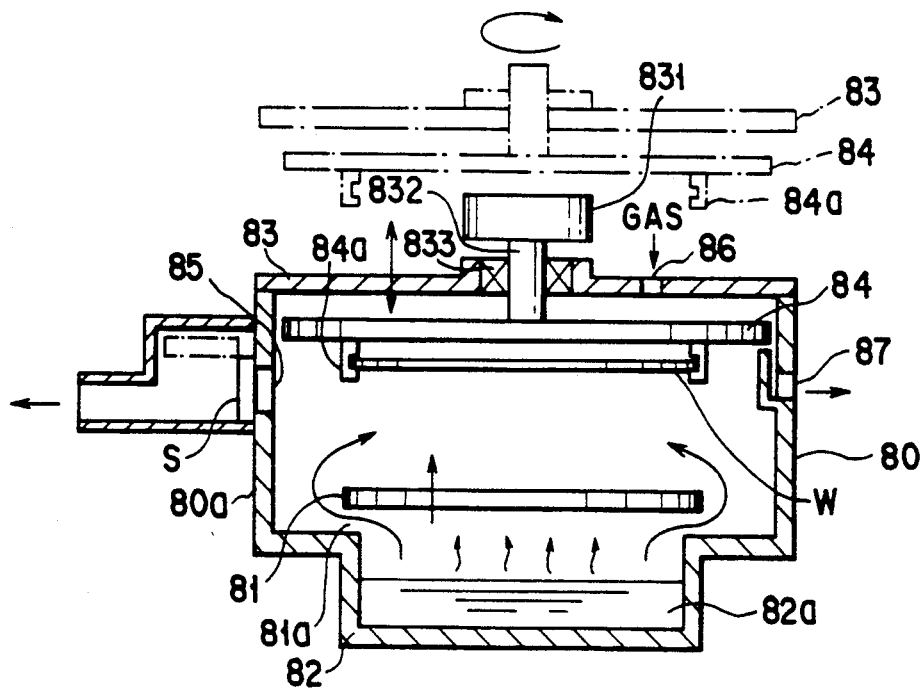
FIG. 5 is a vertically-sectioned view schematically showing the washing unit closing its top lid.

When the top lid 83 is detached from the process vessel 80a as shown in FIG. 4, the switch valve 81 closes the recess 82 not to cause any vapor of hydrofluoric acid from the solution 82a. When the process vessel 80a is closed by the top lid 83 as shown in FIG. 5, the switch valve 81 is lifted to create a clearance 81a between the bottom of the vessel 80a and it. The vapor of hydrofluoric acid is supplied from the recess 82 into the vessel 80a through the clearance 81a.

A shaft 832 rotated round a vertical line by a drive section 831 is fitted into the center of the top lid 83 through a magnetic seal 833 and then into the process vessel 80a. A disk 84 is attached to the lower end of the shaft 832. Further, plural members 84a each having a groove to hold the wafer W are attached to the underside of the disk 84.

The process vessel 80a includes an exhaust or discharge opening 85 which is opened and closed by a shutter S to stop the vapor of hydrofluoric acid in the vessel 80a from being diffused outside when the top lid 83 is opened. The exhaust opening 85 is communicated with the intake side of the vaccum pump 41.

The top lid 83 includes an opening 86 through which nitrogen gas is introduced into the process vessel 80a. The process vessel 80a also includes an exhaust hole 87 in the side wall thereof to exhaust gas in it outside. The magnetic seal 833 can be thus effectively protected from the vapor of hydrofluoric acid.

When the wafer W is to be washed, it is held by the disk 84, turning its face, which is to be etched, downward. The process vessel 80a is then closed by the top lid 83 and thus kept air tight. The disk 84 is rotated together with the wafer W to a speed of 500 rpm by the drive section 831 and the switch valve 81 is then opened or lifted. The vapor of hydrofluoric acid in the recess 82 is thus uniformly contacted with the surface of the wafer W to thereby remove native oxide (or silicon oxide) from the surface of the wafer W. When the etching process is completed, the shutter S is opened and gas in the process vessel 80a is thus replaced to some extend. The top lid 83 is then lifted and the wafer W held by the disk 84 is exchanged with a new one.

The rising unit 90 will be described referring to FIG. 6.

Arranged at the top of the rinsing unit 90 is a spray nozzle 94, through which pure water is sprayed onto the wafer W on a stage 90. The wafer W is carried into and out of the rinsing unit 90 through an opening 92 of a unit body 91 and cleaning water is drained from the unit 90 through a drain 95.

A series of continuous processes of cleaning, washing, drying and film-forming the silicon wafer W through the system according to the first embodiment of the present invention will be described.

The door D1 is opened and the wafer cassette 54 is carried into the additional chamber 400. The wafer cassette 54 houses 25 sheets of 8-inch silicon wafer W which are not processed yet. The door D1 is closed and the additional chamber 400 is exhausted while supplying nitrogen gas into the chamber 400. The load lock chamber 300 and the lower chamber 200 are also exhausted while supplying nitrogen gas into them. Inside pressure in the additional chamber 400 is kept substantially same as atmospheric pressure. Oxygen in the gas exhausted is detected by the $O_2$ sensor 50a and humidity (or $H_2O$) in it is also detected by the humidity detector 50b. Responsive to these data detected, the controller 60 controls concentrations of $O_2$ and $H_2O$ in the additional chamber 400 to be lower than 1 ppm.

A sheet of the wafer W is picked up out of the wafer cassette 54 and it is carried into the washing unit 80 while turning its to-be-processed face downward. It is washed for about thirty seconds by HF vapor. The native oxide of $SiO_2$ is thus removed from the face of the wafer W. After the washing process, the wafer W is water-washed in the rinsing unit 90 and heated and dried in the heating unit 70. A power of 500 W, total sum, is applied to the infrared ray lamps 75 during the heating and drying process and the surface of the wafer W is thus heated to about 70°. The heating time is about 1 minute, for example, although it depends on how the wafer W is separated from the infrared ray lamps 75.

The gate G1 is opened and the wafer W is carried from the additional chamber 400 into the load lock chamber 300 by the robot 31. The wafer w is mounted on the pre-alignment state 32. The orientation flat of the wafer W is aligned on the state 32. The gate G1 is closed and nitrogen gas is supplied into the load lock chamber 300 to fill it.

On the other hand, the boat B is lifted by the elevator mechanism 20 to position its lower wafer holder ring just before the gate G2. Nitrogen gas in the lower chamber 200 is purged. When the load lock chamber 300 and the lower chamber 200 are enough filled with nitrogen gas, gate G2 is opened. Inside pressures in them are same this time as atmospheric pressure. The wafer W having no native oxide on it is loaded in the boat B. Wile repeating this process, a predetermined number of the wafer sheets are loaded in the boat B.

The gate valve G2 is closed and the boat G is loaded into the process tube 2. Process gas is supplied into the process tube 2, which is being heated, to apply the film-forming process to the wafer W. After the film-forming process, the boat B is lowered into the lower chamber 200. The gate valve G2 is opened and the wafers W in the boat B are carried one by one out of the lower chamber 200.

According to the first embodiment of the present invention, the wafer W is put in the atmosphere of inactive gas just after the native oxide is removed from it, and it is then introduced into the process tube without contacting atmosphere outside. In addition, the sub-product remaining on it at the time of the washing process is decomposed and removed by heating applied to it on its way to the process tube. This enables the film-forming process to be applied to its extremely clean face. The film-forming process through the CVD apparatus lasts about 3-4 hours.

According to tests conducted by the inventors of the present invention, the re-growth of the native oxide is hardly recognized until several ten hours pass when the wafer W is put in the atmosphere of inactive gas after it is washed. When it is put in the air, however, the re-growth of the native oxide is recognized even after the lapse of 1 or 2 hours, at the last. It is therefore quite effective that a plurality of the wafers W are kept in the atmosphere of inactive gas in that case where they are left for a long time until they are film-formed after their washing process.

Figure 7:
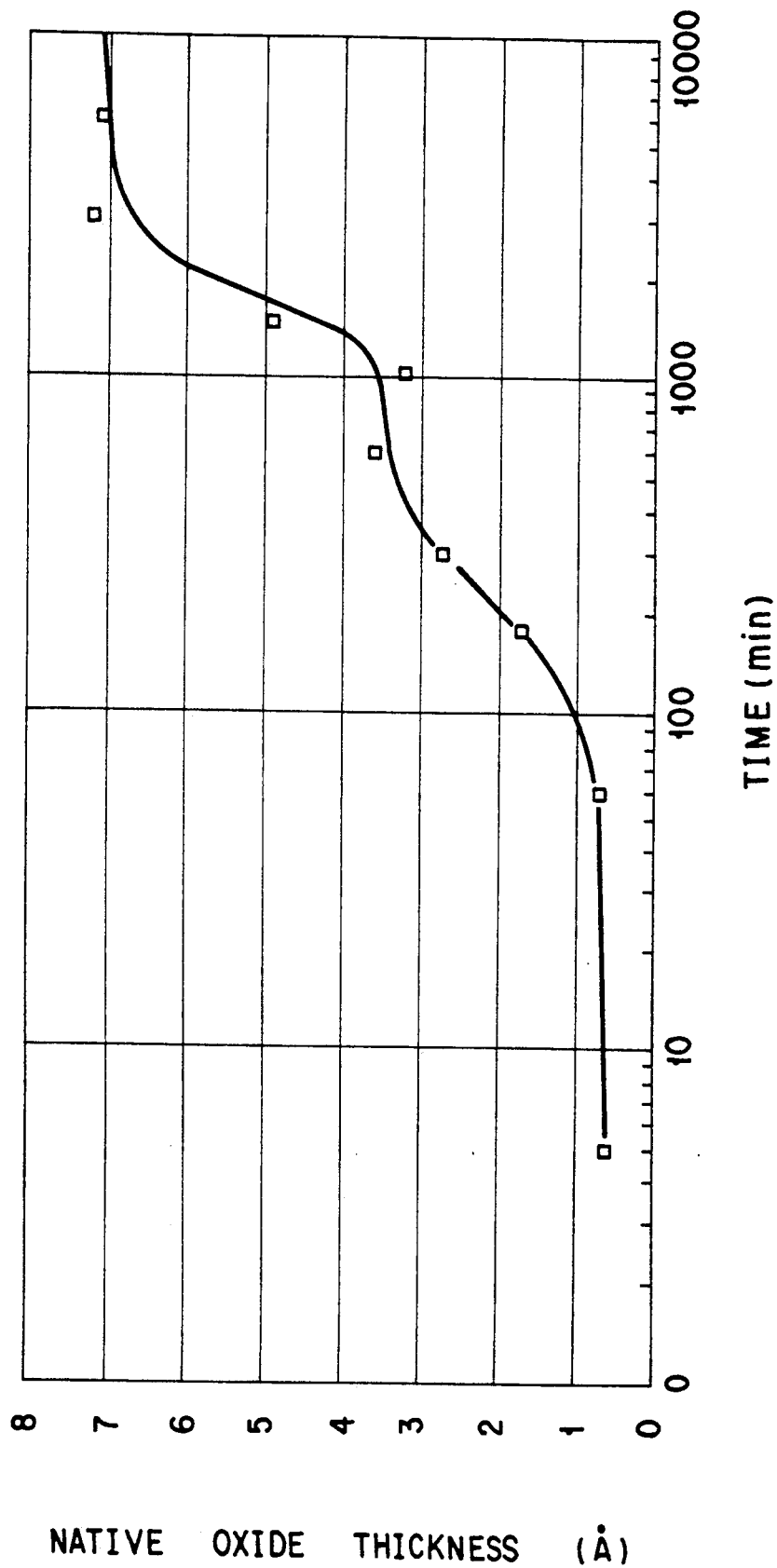
FIG. 7 is a graph showing how native oxide grows.

FIG. 7 is a graph showing the growing process of the native oxide, in which the time during which the silicon wafer W is left in the air of normal temperature and pressure is plotted on the horizontal axis and the thickness of the native oxide on the vertical axis. As apparent from this graph, it has been found that the native oxide hardly grows for an initial time of 100 minutes but that it grows step by step by 2 or 3 Å after this initial time of 100 minutes.

The system according to a second embodiment of the present invention will be described referring to FIGS. 8 and 9. Description on same components as those in the first system will be omitted.

As shown in FIG. 8, the washing and rinsing units 80 and 90, the wafer transfer mechanism 53 and the cassette stages 52 are not enclosed by the chamber wall but put in the atmosphere of the clean room. The washing, rinsing units 80, 90 and the two cassette stages 52 are arranged enclosing the wafer transfer mechanism 53, which is opposed to a front gate G3 of a heating and drying chamber 500. Another rear gate G4 is arranged between the heating and drying chamber 500 and the load lock chamber 300.

Figure 9:
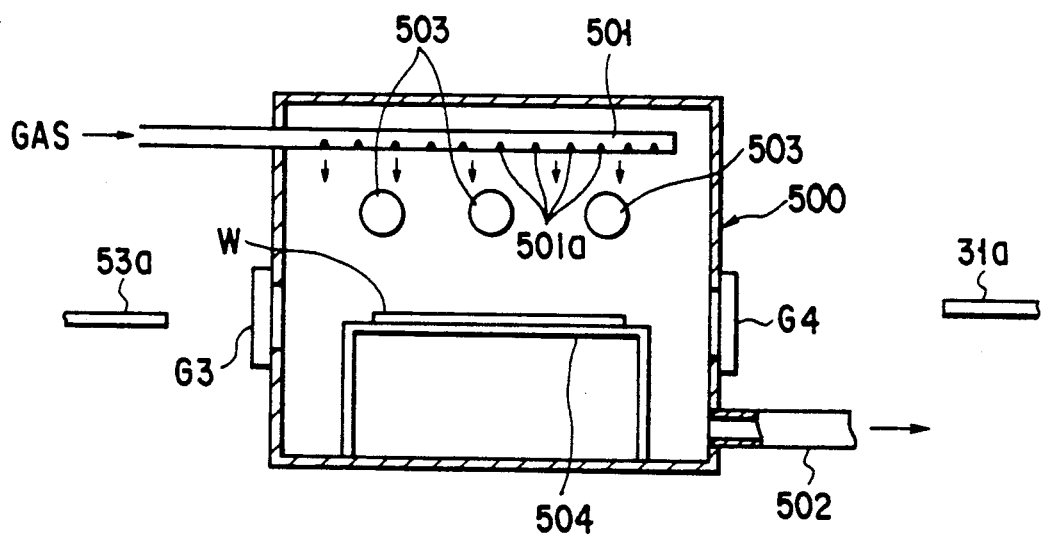
FIG. 9 is a vertically-sectioned view showing a heating chamber (or second load lock chamber) employed by the second system.

As shown in FIG. 9, the wafer W is lamp-heated in the heating and drying chamber 500 while blowing nitrogen gas to it. A gas blowing conduit 501 is inserted into the chamber 500, passing through the upper portion of a side wall of the chamber 500. The base end of the gas blowing conduit 501 is communicated with the gas supply source 43, while nitrogen gas is blown into the chamber 500 through a plurality of apertures 501a at the free front end of the gas blowing conduit 501. The chamber 500 is communicated with the vacuum pump 41 through an exhaust or discharge passage 502.

Three infrared ray lamps 503 are arranged between the free front end of the conduit 501 and a wafer stage 504 in the chamber 500. They are substantially same as those in the first system. The top of the wafer stage 504 is shaped like a lattice or net so as to enable cleaning or rinsing liquid to be easily removed from the wafer W.

The load lock and load/unload chambers 300 and 200 are substantially same as those in the first system. A cassette chamber 600 is arranged adjacent to the load lock chamber 300. It is provided with two stages 52, a door D2 and a gate G5. When the door D2 is opened, the cassette chamber 600 is communicated with the clean room and the wafer cassettes 54 are carried into and out of the cassette chamber 600 by robots (not shown). When the gate G5 is opened, the cassette chamber 600 is communicated with the load lock chamber 300 and the cleaned wafer W picked up out of and loaded into one of the cassettes 54.

Gas supply and exhaust passages 601 and 602 are communicated with the cassette chamber 600. The gas supply passage 601 is connected to the nitrogen gas supply source 43 while the gas exhaust passage 602 to the intake side of the vacuum pump 41.

According to the above described second system, the wafers W are contacted with air after they are washed, but they are immediately carried into the chamber 500 without being left in the air for a long time. Therefore, the growth of the native oxide is negligible.

Further, the wafers W from which the native oxide has been removed can be temporarily kept in the cassette chamber 600. This enhances the throughput of wafers film-formed.

The system according to the present invention can be variously changed depending upon the whole layout of the apparatus in the clean room and also upon the timings at which processes are conducted in various sections of the apparatus. It may be arranged, for example, that the load lock and additional chambers are provided with openings through which the processed wafers can be carried outside.

Further, casters may be attached to the bottom of each of the chambers to carry them. When their gas introducing and exhausting pipes are made detachable in this case, they can be detached from the process chamber (or CVD apparatus) to thereby change the layout of the system freely. This can be quite useful in a case where plural process chambers (or CVD apparatuses) are used.

Still further, hot plates and others may be used as means for heating wafers after they are washed.

Still further, the washing unit is not limited to those which use the vapor of hydrofluoric acid, but it may be of such type that allows the wafers W to be immersed in some intended liquid.

According to the present invention wafers to be washed are kept in the atmosphere of inactive gas without being contacted with air after the native oxide is removed from them. The re growth of the native oxide on them is thus stopped so that the film-forming process can be applied to their quite clean surfaces. In the case of semiconductor devices, therefore, the thickness of gate oxide film can be controlled with a higher accuracy or a desired contact resistance can be attained with a higher reliability. This can meet any needs upon making the devices more highly integrated.

The system of the present invention can be applied to the oxidizing and diffusing apparatus as well as the CVD one.

According to the above described system of the present invention, wafers are kept in an extremely clean atmosphere, in which oxygen and water are less contained, immediately after the native oxide is removed from them. The re growth of the native oxide can be thus stopped. In the case of the semiconductor devices, therefore, the thickness of gate oxide film can be controlled with a higher accuracy or a desired contact resistance can be attained with a higher reliability. This can sufficiently meet any needs asked when the devices must be more highly integrated.

Further, heating means are arranged in the load lock chamber. The sub-product on the surface of the to-be-processed matter which is caused during the washing process can be thus heated and decomposed, so that the surface of the matter to which the film-forming process is to be applied can be made more clean.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept a defined by the appended claims and their equivalents.

What is claimed is:

1. A system for washing and film-forming a semiconductor wafer continuously comprising:
    a washing section for removing native oxide from the surface of the semiconductor wafer, which is to be film-formed, while applying an intended solution to the wafer;
    a load lock chamber located adjacent to the washing section and filled with an atmosphere of non-oxidizing gas;
    a film-forming section having gate means and communicated with and shielded from the load lock chamber by the gate means to apply the film-forming process to that face of the wafer which is to be processed;
    first transfer means for transferring the wafer between the washing section and the load lock chamber; and
    second transfer means for transferring the wafer between the load lock chamber and the film-forming section;
    wherein the wafer is coated with a film in the film-forming section after the native oxide is removed from the wafer in the washing section.

2. The system according to claim 1, further comprising heating means for heating the wafer which has been washed in the washing section.

3. The system according to claim 2, further comprising means for supplying the non-oxidizing gas into an additional chamber and exhausting means for exhausting the gas from the additional chamber, wherein said heating means is arranged together with the washing section and the first transfer means in the additional chamber.

4. The system according to claim 3, further comprising rinsing means arranged in the additional chamber to wash the wafer after the native oxide is removed from the wafer.

5. The system according to claim 3, further comprising a cassette station arranged in the additional chamber to temporarily keep the wafer therein before the native oxide is removed from the wafer.

6. The system according to claim 3, further comprising means for controlling the atmosphere in the additional chamber.

7. The system according to claim 6, wherein said atmosphere controlling means includes an oxygen detector, a humidity detector, and a controller for adjusting the amounts of the non-oxidizing gas supplied into and exhausted from the additional chamber in response to an oxygen gas and a humidity detected.

8. The system according to claim 2, wherein said heating means are infrared ray lamps arranged in a chamber independent of the others.

9. The system according to claim 8, further comprising a gas blowing conduit introduced into the heating chamber to blow the non-oxidizing gas to the wafer through said conduit.

10. The system according to claim 1, further comprising a cassette station for temporarily keeping the wafer therein before the native oxide is removed from the wafer.

11. The system according to claim 1, further comprising a cassette station for temporarily keeping the wafer therein after the native oxide is removed from the wafer.

12. The system according to claim 1, wherein said cleaning section includes a process vessel provided with a lid in which a vapor of the intended solution is applied to the wafer.

* * * * *